US007498767B2

(12) United States Patent
Brown et al.

(10) Patent No.: US 7,498,767 B2
(45) Date of Patent: Mar. 3, 2009

(54) CENTRALIZED DATA STORAGE OF CONDITION OF A STORAGE BATTERY AT ITS POINT OF SALE

(75) Inventors: Dennis V. Brown, Plano, TX (US); Stephen J. McShane, Oak Brook, IL (US); Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 423 days.

(21) Appl. No.: 11/356,299

(22) Filed: Feb. 16, 2006

(65) Prior Publication Data
US 2006/0192564 A1 Aug. 31, 2006

Related U.S. Application Data

(60) Provisional application No. 60/653,537, filed on Feb. 16, 2005.

(51) Int. Cl.
*H01M 10/46* (2006.01)
(52) U.S. Cl. ...................................................... 320/107
(58) Field of Classification Search ................. 320/107, 320/114, 115, 132, 149; 324/426, 427, 433
See application file for complete search history.

(56) References Cited

U.S. PATENT DOCUMENTS

| | | | | |
|---|---|---|---|---|
| 2,000,665 | A | 5/1935 | Neal | 439/440 |
| 2,514,745 | A | 7/1950 | Dalzell | 324/115 |
| 3,267,452 | A | 8/1966 | Wolf | 340/249 |
| 3,356,936 | A | 12/1967 | Smith | 324/429 |
| 3,562,634 | A | 2/1971 | Latner | 324/427 |
| 3,593,099 | A | 7/1971 | Scholl | 320/127 |
| 3,607,673 | A | 9/1971 | Seyl | 324/425 |
| 3,652,341 | A | 3/1972 | Halsall et al. | 29/623.2 |
| 3,676,770 | A | 7/1972 | Sharaf et al. | 324/430 |
| 3,729,989 | A | 5/1973 | Little | 73/862.192 |
| 3,750,011 | A | 7/1973 | Kreps | 324/430 |
| 3,753,094 | A | 8/1973 | Furuishi et al. | 324/430 |

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International*, Apr. 1997, pp. 59, and 62-63.

(Continued)

*Primary Examiner*—Edward Tso
(74) *Attorney, Agent, or Firm*—Leanne Taveggia Farrell; Westman, Champlin & Kelly, P.A.

(57) ABSTRACT

Methods and systems are provided for monitoring replacing of a previously purchased storage battery with a replacement storage battery. A battery tester is coupled to the replacement storage battery. A replacement storage battery identifier is entered into the battery tester that identifies the replacement storage battery. The battery tester performs a battery test on the replacement storage battery. A replacement battery test code is generated using the battery test and the replacement storage battery identifier. The replacement battery test code is communicated to a centralized database. The replacement battery test code is associated with a battery test code related to the previously purchased storage battery in the centralized database.

35 Claims, 4 Drawing Sheets

U.S. PATENT DOCUMENTS

| | | | | |
|---|---|---|---|---|
| 3,796,124 A | 3/1974 | Crosa | | 411/521 |
| 3,808,522 A | 4/1974 | Sharaf | | 324/430 |
| 3,811,089 A | 5/1974 | Strezelewicz | | 324/170 |
| 3,873,911 A | 3/1975 | Champlin | | 324/430 |
| 3,876,931 A | 4/1975 | Godshalk | | 324/429 |
| 3,886,443 A | 5/1975 | Miyakawa et al. | | 324/426 |
| 3,889,248 A | 6/1975 | Ritter | | 340/636.11 |
| 3,906,329 A | 9/1975 | Bader | | 320/134 |
| 3,909,708 A | 9/1975 | Champlin | | 324/431 |
| 3,936,744 A | 2/1976 | Perlmutter | | 324/772 |
| 3,946,299 A | 3/1976 | Christianson et al. | | 320/430 |
| 3,947,757 A | 3/1976 | Grube et al. | | 324/416 |
| 3,969,667 A | 7/1976 | McWilliams | | 324/427 |
| 3,979,664 A | 9/1976 | Harris | | 324/397 |
| 3,984,762 A | 10/1976 | Dowgiallo, Jr. | | 324/430 |
| 3,984,768 A | 10/1976 | Staples | | 324/712 |
| 3,989,544 A | 11/1976 | Santo | | 429/65 |
| 4,008,619 A | 2/1977 | Alcaide et al. | | 73/724 |
| 4,023,882 A | 5/1977 | Pettersson | | 439/426 |
| 4,024,953 A | 5/1977 | Nailor, III | | 206/344 |
| 4,047,091 A | 9/1977 | Hutchines et al. | | 363/59 |
| 4,053,824 A | 10/1977 | Dupuis et al. | | 324/434 |
| 4,056,764 A | 11/1977 | Endo et al. | | 320/101 |
| 4,070,624 A | 1/1978 | Taylor | | 324/772 |
| 4,086,531 A | 4/1978 | Bernier | | 324/772 |
| 4,106,025 A | 8/1978 | Katz | | 343/715 |
| 4,112,351 A | 9/1978 | Back et al. | | 324/380 |
| 4,114,083 A | 9/1978 | Benham et al. | | 340/636.13 |
| 4,126,874 A | 11/1978 | Suzuki et al. | | 396/301 |
| 4,160,916 A | 7/1979 | Papasideris | | 307/10.6 |
| 4,178,546 A | 12/1979 | Hulls et al. | | 324/772 |
| 4,193,025 A | 3/1980 | Frailing et al. | | 324/427 |
| 4,207,611 A | 6/1980 | Gordon | | 701/33 |
| 4,217,645 A | 8/1980 | Barry et al. | | 702/63 |
| 4,280,457 A | 7/1981 | Bloxham | | 123/198 R |
| 4,297,639 A | 10/1981 | Branham | | 324/429 |
| 4,307,342 A | 12/1981 | Peterson | | 324/767 |
| 4,315,204 A | 2/1982 | Sievers et al. | | 322/28 |
| 4,316,185 A | 2/1982 | Watrous et al. | | 340/636.11 |
| 4,322,685 A | 3/1982 | Frailing et al. | | 324/429 |
| 4,351,405 A | 9/1982 | Fields et al. | | 180/65.2 |
| 4,352,067 A | 9/1982 | Ottone | | 324/434 |
| 4,360,780 A | 11/1982 | Skutch, Jr. | | 324/437 |
| 4,361,809 A | 11/1982 | Bil et al. | | 324/426 |
| 4,363,407 A | 12/1982 | Buckler et al. | | 209/3.3 |
| 4,369,407 A | 1/1983 | Korbell | | 324/416 |
| 4,379,989 A | 4/1983 | Kurz et al. | | 320/165 |
| 4,379,990 A | 4/1983 | Sievers et al. | | 322/99 |
| 4,385,269 A | 5/1983 | Aspinwall et al. | | 320/129 |
| 4,390,828 A | 6/1983 | Converse et al. | | 320/153 |
| 4,392,101 A | 7/1983 | Saar et al. | | 320/156 |
| 4,396,880 A | 8/1983 | Windebank | | 320/156 |
| 4,408,157 A | 10/1983 | Beaubien | | 324/712 |
| 4,412,169 A | 10/1983 | Dell'Orto | | 320/123 |
| 4,423,378 A | 12/1983 | Marino et al. | | 324/427 |
| 4,423,379 A | 12/1983 | Jacobs et al. | | 324/429 |
| 4,424,491 A | 1/1984 | Bobbett et al. | | 324/433 |
| 4,459,548 A | 7/1984 | Lentz et al. | | 324/472 |
| 4,514,694 A | 4/1985 | Finger | | 324/429 |
| 4,520,353 A | 5/1985 | McAuliffe | | 340/636.16 |
| 4,521,498 A | 6/1985 | Juergens | | 429/59 |
| 4,564,798 A | 1/1986 | Young | | 320/103 |
| 4,620,767 A | 11/1986 | Woolf | | 439/217 |
| 4,633,418 A | 12/1986 | Bishop | | 702/63 |
| 4,659,977 A | 4/1987 | Kissel et al. | | 320/150 |
| 4,663,580 A | 5/1987 | Wortman | | 320/153 |
| 4,665,370 A | 5/1987 | Holland | | 324/429 |
| 4,667,143 A | 5/1987 | Cooper et al. | | 320/153 |
| 4,667,279 A | 5/1987 | Maier | | 363/46 |
| 4,678,998 A | 7/1987 | Muramatsu | | 324/427 |
| 4,679,000 A | 7/1987 | Clark | | 324/428 |
| 4,680,528 A | 7/1987 | Mikami et al. | | 320/165 |
| 4,686,442 A | 8/1987 | Radomski | | 320/123 |
| 4,697,134 A | 9/1987 | Burkum et al. | | 320/134 |
| 4,707,795 A | 11/1987 | Alber et al. | | 702/63 |
| 4,709,202 A | 11/1987 | Koenck et al. | | 320/112 |
| 4,710,861 A | 12/1987 | Kanner | | 363/46 |
| 4,719,428 A | 1/1988 | Liebermann | | 324/436 |
| 4,723,656 A | 2/1988 | Kiernan et al. | | 206/705 |
| 4,743,855 A | 5/1988 | Randin et al. | | 324/430 |
| 4,745,349 A | 5/1988 | Palanisamy et al. | | 320/125 |
| 4,781,629 A | 11/1988 | Mize | | 439/822 |
| 4,816,768 A | 3/1989 | Champlin | | 324/428 |
| 4,820,966 A | 4/1989 | Fridman | | 320/116 |
| 4,825,170 A | 4/1989 | Champlin | | 324/436 |
| 4,847,547 A | 7/1989 | Eng, Jr. et al. | | 320/153 |
| 4,849,700 A | 7/1989 | Morioka et al. | | 324/427 |
| 4,874,679 A | 10/1989 | Miyagawa | | 429/91 |
| 4,876,495 A | 10/1989 | Palanisamy et al. | | 320/106 |
| 4,881,038 A | 11/1989 | Champlin | | 324/426 |
| 4,888,716 A | 12/1989 | Ueno | | 702/63 |
| 4,901,007 A | 2/1990 | Sworm | | |
| 4,907,176 A | 3/1990 | Bahnick et al. | | 364/551.01 |
| 4,912,416 A | 3/1990 | Champlin | | 324/430 |
| 4,913,116 A | 4/1990 | Katogi et al. | | 123/406.32 |
| 4,926,330 A | 5/1990 | Abe et al. | | 701/33 |
| 4,929,931 A | 5/1990 | McCuen | | 340/636.15 |
| 4,931,738 A | 6/1990 | MacIntyre et al. | | 324/435 |
| 4,932,905 A | 6/1990 | Richards | | 439/822 |
| 4,933,845 A | 6/1990 | Hayes | | 710/104 |
| 4,934,957 A | 6/1990 | Bellusci | | 439/504 |
| 4,937,528 A | 6/1990 | Palanisamy | | 324/430 |
| 4,947,124 A | 8/1990 | Hauser | | 324/430 |
| 4,949,046 A | 8/1990 | Seyfang | | 324/427 |
| 4,956,597 A | 9/1990 | Heavey et al. | | 320/129 |
| 4,968,941 A | 11/1990 | Rogers | | 324/428 |
| 4,968,942 A | 11/1990 | Palanisamy | | 324/430 |
| 4,969,834 A | 11/1990 | Johnson | | 439/141 |
| 4,983,086 A | 1/1991 | Hatrock | | 411/259 |
| 5,004,979 A | 4/1991 | Marino et al. | | 324/160 |
| 5,032,825 A | 7/1991 | Kuznicki | | 340/636.15 |
| 5,037,778 A | 8/1991 | Stark et al. | | 228/121 |
| 5,047,722 A | 9/1991 | Wurst et al. | | 324/430 |
| 5,081,565 A | 1/1992 | Nabha et al. | | 362/465 |
| 5,087,881 A | 2/1992 | Peacock | | 324/378 |
| 5,095,223 A | 3/1992 | Thomas | | 307/110 |
| 5,108,320 A | 4/1992 | Kimber | | 439/883 |
| 5,126,675 A | 6/1992 | Yang | | 324/435 |
| 5,130,658 A | 7/1992 | Bohmer | | 324/435 |
| 5,140,269 A | 8/1992 | Champlin | | 324/433 |
| 5,144,218 A | 9/1992 | Bosscha | | 320/139 |
| 5,144,248 A | 9/1992 | Alexandres et al. | | 324/428 |
| 5,159,272 A | 10/1992 | Rao et al. | | 324/429 |
| 5,160,881 A | 11/1992 | Schramm et al. | | 322/7 |
| 5,168,208 A | 12/1992 | Schultz et al. | | 322/25 |
| 5,170,124 A | 12/1992 | Blair et al. | | 324/434 |
| 5,179,335 A | 1/1993 | Nor | | 320/159 |
| 5,194,799 A | 3/1993 | Tomantschger | | 320/103 |
| 5,204,611 A | 4/1993 | Nor et al. | | 320/145 |
| 5,214,370 A | 5/1993 | Harm et al. | | 320/152 |
| 5,214,385 A | 5/1993 | Gabriel et al. | | 324/434 |
| 5,241,275 A | 8/1993 | Fang | | 324/430 |
| 5,254,952 A | 10/1993 | Salley et al. | | 324/429 |
| 5,266,880 A | 11/1993 | Newland | | 320/125 |
| 5,281,919 A | 1/1994 | Palanisamy | | 324/427 |
| 5,281,920 A | 1/1994 | Wurst | | 324/430 |
| 5,295,078 A | 3/1994 | Stich et al. | | 700/297 |
| 5,298,797 A | 3/1994 | Redl | | 327/387 |
| 5,300,874 A | 4/1994 | Shimamoto et al. | | 320/106 |
| 5,302,902 A | 4/1994 | Groehl | | 324/434 |
| 5,313,152 A | 5/1994 | Wozniak et al. | | 320/118 |
| 5,315,287 A | 5/1994 | Sol | | 340/455 |
| 5,321,626 A | 6/1994 | Palladino | | 702/63 |
| 5,321,627 A | 6/1994 | Reher | | 702/63 |

| Patent No. | Date | Inventor | Class |
|---|---|---|---|
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/148 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 713/300 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,100,670 A | 8/2000 | Levesque | 320/150 |

| | | | | | | |
|---|---|---|---|---|---|---|
| 6,104,167 | A | 8/2000 | Bertness et al. ............... 320/132 | 6,529,723 B1 | 3/2003 | Bentley ....................... 455/405 |
| 6,113,262 | A | 9/2000 | Purola et al. | 6,531,848 B1 | 3/2003 | Chitsazan et al. ............ 320/153 |
| 6,114,834 | A | 9/2000 | Parise ........................ 320/109 | 6,532,425 B1 | 3/2003 | Boost et al. |
| 6,137,269 | A | 10/2000 | Champlin .................... 320/150 | 6,534,993 B2 | 3/2003 | Bertness ...................... 324/433 |
| 6,140,797 | A | 10/2000 | Dunn ........................... 320/105 | 6,544,078 B2 | 4/2003 | Palmisano et al. ........... 439/762 |
| 6,144,185 | A | 11/2000 | Dougherty et al. ............ 320/132 | 6,556,019 B2 | 4/2003 | Bertness ...................... 324/426 |
| 6,150,793 | A | 11/2000 | Lesesky et al. ................ 320/104 | 6,566,883 B1 | 5/2003 | Vonderhaar et al. .......... 324/426 |
| 6,158,000 | A | 12/2000 | Collins ............................ 713/1 | 6,570,385 B1 | 5/2003 | Roberts et al. ................ 324/378 |
| 6,161,640 | A | 12/2000 | Yamaguchi .................. 180/65.8 | 6,577,107 B1 | 6/2003 | Kechmire ..................... 320/139 |
| 6,163,156 | A | 12/2000 | Bertness ...................... 324/426 | 6,586,941 B2 | 7/2003 | Bertness et al. ............... 324/426 |
| 6,167,349 | A | 12/2000 | Alvarez .......................... 702/63 | 6,597,150 B1 | 7/2003 | Bertness et al. ............... 320/104 |
| 6,172,483 | B1 | 1/2001 | Champlin .................... 320/134 | 6,600,815 B1 | 7/2003 | Walding .................... 379/93.07 |
| 6,172,505 | B1 | 1/2001 | Bertness ...................... 324/430 | 6,618,644 B2 | 9/2003 | Bean ............................. 700/231 |
| 6,177,737 | B1 | 1/2001 | Palfey et al. .................... 307/64 | 6,621,272 B2 | 9/2003 | Champlin .................... 324/426 |
| 6,181,545 | B1 | 1/2001 | Amatucci et al. ............. 361/502 | 6,623,314 B1 | 9/2003 | Cox et al. ..................... 439/759 |
| 6,211,651 | B1 | 4/2001 | Nemoto ....................... 320/133 | 6,628,011 B2 | 9/2003 | Droppo et al. .................. 307/43 |
| 6,215,275 | B1 | 4/2001 | Bean ............................ 320/106 | 6,629,054 B2 | 9/2003 | Makhija et al. ................ 702/113 |
| 6,222,342 | B1 | 4/2001 | Eggert et al. ................. 320/105 | 6,633,165 B2 | 10/2003 | Bertness ...................... 324/426 |
| 6,222,369 | B1 | 4/2001 | Champlin .................... 324/430 | 6,667,624 B1 | 12/2003 | Raichle et al. ................ 324/522 |
| D442,503 | S | 5/2001 | Lundbeck et al. .............. D10/77 | 6,679,212 B2 | 1/2004 | Kelling .................... 123/179.28 |
| 6,225,808 | B1 | 5/2001 | Varghese et al. .............. 324/426 | 6,686,542 B2 | 2/2004 | Zhang ............................ 174/74 |
| 6,236,332 | B1 | 5/2001 | Conkright et al. ............. 340/3.1 | 6,696,819 B2 | 2/2004 | Bertness ...................... 320/134 |
| 6,238,253 | B1 | 5/2001 | Qualls ......................... 439/759 | 6,707,303 B2 | 3/2004 | Bertness et al. ............... 324/426 |
| 6,242,887 | B1 | 6/2001 | Burke .......................... 320/104 | 6,737,831 B2 | 5/2004 | Champlin .................... 320/132 |
| 6,249,124 | B1 | 6/2001 | Bertness ...................... 324/426 | 6,740,990 B2 | 5/2004 | Tozuka et al. |
| 6,250,973 | B1 | 6/2001 | Lowery et al. ................ 439/763 | 6,759,849 B2 | 7/2004 | Bertness ...................... 324/426 |
| 6,254,438 | B1 | 7/2001 | Gaunt ......................... 439/755 | 6,777,945 B2 | 8/2004 | Roberts et al. ................ 324/426 |
| 6,259,170 | B1 | 7/2001 | Limoge et al. ............... 307/10.8 | 6,781,382 B2 | 8/2004 | Johnson ....................... 324/426 |
| 6,259,254 | B1 | 7/2001 | Klang .......................... 324/427 | 6,784,635 B2 | 8/2004 | Larson |
| 6,262,563 | B1 | 7/2001 | Champlin .................... 320/132 | 6,784,637 B2 | 8/2004 | Raichle et al. ................ 320/107 |
| 6,263,268 | B1 | 7/2001 | Nathanson ..................... 701/29 | 6,788,025 B2 | 9/2004 | Bertness et al. ............... 320/104 |
| 6,271,643 | B1 | 8/2001 | Becker et al. ................. 320/112 | 6,795,782 B2 | 9/2004 | Bertness et al. ................. 702/63 |
| 6,275,008 | B1 | 8/2001 | Arai et al. ..................... 320/132 | 6,805,090 B2 | 10/2004 | Bertness et al. ............... 123/198 |
| 6,294,896 | B1 | 9/2001 | Champlin .................... 320/134 | 6,806,716 B2 | 10/2004 | Bertness et al. ............... 324/426 |
| 6,294,897 | B1 | 9/2001 | Champlin .................... 320/153 | 6,825,669 B2 | 11/2004 | Raichle et al. ................ 324/426 |
| 6,304,087 | B1 | 10/2001 | Bertness ...................... 324/426 | 6,842,707 B2 | 1/2005 | Raichle et al. .................. 702/62 |
| 6,307,349 | B1 | 10/2001 | Koenck et al. ................ 320/112 | 6,850,037 B2 | 2/2005 | Bertness ...................... 320/132 |
| 6,310,481 | B2 | 10/2001 | Bertness ...................... 324/430 | 6,871,151 B2 | 3/2005 | Bertness ........................ 702/63 |
| 6,313,607 | B1 | 11/2001 | Champlin .................... 320/132 | 6,885,195 B2 | 4/2005 | Bertness ...................... 324/426 |
| 6,313,608 | B1 | 11/2001 | Varghese et al. .............. 320/132 | 6,888,468 B2 | 5/2005 | Bertness .................. 340/636.15 |
| 6,316,914 | B1 | 11/2001 | Bertness ...................... 320/134 | 6,891,378 B2 | 5/2005 | Bertness et al. ............... 324/426 |
| 6,320,351 | B1 | 11/2001 | Ng et al. ...................... 320/104 | 6,904,796 B2 | 6/2005 | Pacsai et al. ................. 73/146.8 |
| 6,323,650 | B1 | 11/2001 | Bertness et al. ............... 324/426 | 6,906,522 B2 | 6/2005 | Bertness et al. ............... 324/426 |
| 6,329,793 | B1 | 12/2001 | Bertness et al. ............... 320/132 | 6,906,523 B2 | 6/2005 | Bertness et al. ............... 324/426 |
| 6,331,762 | B1 | 12/2001 | Bertness ...................... 320/134 | 6,906,624 B2 | 6/2005 | McClelland et al. .......... 340/442 |
| 6,332,113 | B1 | 12/2001 | Bertness ........................ 702/63 | 6,909,287 B2 | 6/2005 | Bertness ...................... 324/427 |
| 6,346,795 | B2 | 2/2002 | Haraguchi et al. ............ 320/136 | 6,913,483 B2 | 7/2005 | Restaino et al. ............... 439/504 |
| 6,347,958 | B1 | 2/2002 | Tsai ............................. 439/488 | 6,914,413 B2 | 7/2005 | Bertness et al. ............... 320/104 |
| 6,351,102 | B1 | 2/2002 | Troy ............................ 320/139 | 6,919,725 B2 | 7/2005 | Bertness et al. ............... 324/433 |
| 6,356,042 | B1 | 3/2002 | Kahlon et al. ................ 318/138 | 6,930,485 B2 | 8/2005 | Bertness et al. ............... 324/426 |
| 6,359,441 | B1 | 3/2002 | Bertness ...................... 324/430 | 6,941,234 B2 | 9/2005 | Bertness et al. .................. 702/63 |
| 6,359,442 | B1 | 3/2002 | Henningson et al. ......... 324/426 | 7,119,686 B2 | 10/2006 | Bertness et al. |
| 6,363,303 | B1 | 3/2002 | Bertness ........................ 701/29 | 2002/0010558 A1 | 1/2002 | Bertness et al. ................. 702/63 |
| RE37,677 | E | 4/2002 | Irie ............................... 315/83 | 2002/0041175 A1 | 4/2002 | Lauper et al. ................. 320/106 |
| 6,384,608 | B1 | 5/2002 | Namaky ...................... 324/430 | 2002/0171428 A1 | 11/2002 | Bertness ........................ 702/63 |
| 6,388,448 | B1 | 5/2002 | Cervas ......................... 324/426 | 2002/0176010 A1 | 11/2002 | Wallach et al. ................ 348/362 |
| 6,392,414 | B2 | 5/2002 | Bertness ...................... 324/429 | 2003/0025481 A1 | 2/2003 | Bertness ...................... 324/427 |
| 6,396,278 | B1 | 5/2002 | Makhija ....................... 324/402 | 2003/0036909 A1 | 2/2003 | Kato ............................ 704/275 |
| 6,407,554 | B1 | 6/2002 | Godau et al. | 2003/0088375 A1 | 5/2003 | Bertness et al. ................. 702/63 |
| 6,411,098 | B1 | 6/2002 | Laletin ........................ 324/436 | 2003/0169018 A1 | 9/2003 | Berel et al. |
| 6,417,669 | B1 | 7/2002 | Champlin .................... 324/426 | 2003/0184262 A1 | 10/2003 | Makhija ...................... 320/156 |
| 6,424,157 | B1 | 7/2002 | Gollomp et al. .............. 324/430 | 2003/0184306 A1 | 10/2003 | Bertness et al. ............... 324/426 |
| 6,424,158 | B2 | 7/2002 | Klang .......................... 324/433 | 2003/0194672 A1 | 10/2003 | Roberts et al. ................ 431/196 |
| 6,441,585 | B1 | 8/2002 | Bertness ...................... 320/132 | 2004/0000590 A1 | 1/2004 | Raichle et al. ............ 235/462.01 |
| 6,445,158 | B1 | 9/2002 | Bertness et al. ............... 320/104 | 2004/0000891 A1 | 1/2004 | Raichle et al. ................ 320/107 |
| 6,449,726 | B1 | 9/2002 | Smith .......................... 713/340 | 2004/0000893 A1 | 1/2004 | Raichle et al. ................ 320/135 |
| 6,456,045 | B1 | 9/2002 | Troy et al. .................... 320/139 | 2004/0002824 A1 | 1/2004 | Raichle et al. .................. 702/63 |
| 6,466,025 | B1 | 10/2002 | Klang .......................... 324/429 | 2004/0002825 A1 | 1/2004 | Raichle et al. .................. 702/63 |
| 6,466,026 | B1 | 10/2002 | Champlin .................... 324/430 | 2004/0002836 A1 | 1/2004 | Raichle et al. ................ 702/188 |
| 6,469,511 | B1 | 10/2002 | Vonderhaar et al. .......... 324/425 | 2004/0049361 A1 | 3/2004 | Hamdan et al. ............... 702/115 |
| 6,477,478 | B1 | 11/2002 | Jones et al. | 2004/0051533 A1 | 3/2004 | Namaky ...................... 324/426 |
| 6,495,990 | B2 | 12/2002 | Champlin .................... 320/132 | 2004/0054503 A1 | 3/2004 | Namaky ...................... 702/182 |
| 6,526,361 | B1 | 2/2003 | Jones et al. ..................... 702/63 | 2004/0113588 A1 | 6/2004 | Mikuriya et al. |

| | | | |
|---|---|---|---|
| 2004/0145342 A1 | 7/2004 | Lyon | |
| 2005/0254106 A9 | 11/2005 | Silverbrook et al. | |

FOREIGN PATENT DOCUMENTS

| | | | |
|---|---|---|---|
| EP | 0 022 450 A1 | 1/1981 | |
| EP | 0 637 754 A1 | 2/1995 | |
| EP | 0 772 056 A1 | 5/1997 | |
| FR | 2 749 397 | 12/1997 | |
| GB | 2 029 586 | 3/1980 | |
| GB | 2 088 159 A | 6/1982 | |
| GB | 2 246 916 A | 10/1990 | |
| GB | 2 275 783 A | 7/1994 | |
| GB | 2 387 235 A | 10/2003 | |
| JP | 59-17892 | 1/1984 | |
| JP | 59-17893 | 1/1984 | |
| JP | 59-17894 | 1/1984 | |
| JP | 59017894 | 1/1984 | |
| JP | 59215674 | 12/1984 | |
| JP | 60225078 | 11/1985 | |
| JP | 62-180284 | 8/1987 | |
| JP | 63027776 | 2/1988 | |
| JP | 03274479 | 12/1991 | |
| JP | 03282276 | 12/1991 | |
| JP | 4-8636 | 1/1992 | |
| JP | 04095788 | 3/1992 | |
| JP | 04131779 | 5/1992 | |
| JP | 04372536 | 12/1992 | |
| JP | 05211724 A | 8/1993 | |
| JP | 5216550 | 8/1993 | |
| JP | 7-128414 | 5/1995 | |
| JP | 09061505 | 3/1997 | |
| JP | 10056744 | 2/1998 | |
| JP | 10232273 | 9/1998 | |
| JP | 11103503 A | 4/1999 | |
| RU | 2089015 C1 | 8/1997 | |
| WO | WO 93/22666 | 11/1993 | |
| WO | WO 94/05069 | 3/1994 | |
| WO | WO 96/01456 | 1/1996 | |
| WO | WO 97/44652 | 11/1997 | |
| WO | WO 98/04910 | 2/1998 | |
| WO | WO 98/58270 | 12/1998 | |
| WO | WO 99/23738 | 5/1999 | |
| WO | WO 00/16083 | 3/2000 | |
| WO | WO 00/62049 | 10/2000 | |
| WO | WO 00/67359 | 11/2000 | |
| WO | WO 01/59443 | 2/2001 | |
| WO | WO 01/16614 | 3/2001 | |
| WO | WO 01/16615 | 3/2001 | |
| WO | WO 01/51947 | 7/2001 | |
| WO | WO 03/047064 A3 | 6/2003 | |
| WO | WO 03/076960 A1 | 9/2003 | |
| WO | WO 2004/047215 A1 | 6/2004 | |

OTHER PUBLICATIONS

"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477 , pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113.006, Nov. 1995.
"Performance of Dry Cells"by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Linear Brief 5, Mar. 1969.
Burr-Brown Corporation, "Design A 60 Hz Notch Filter with the UAF42", Jan. 1994, AB-071.
National Semiconductor Corporation, "LMF90-$4^{th}$ -Order Elliptic Notch Filter", RRD-B30M115, Dec. 1994.
"Alligator Clips with Wire Penetrators" *J.S. Popper, Inc.* product information, downloaded from http://www.jspopper.com/, undated.
"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
"DC-DC Converter Basics", *Power Designers*, downloaded from http://www.powederdesigners.com/InforWeb.design_center/articles/DC-DC/converter.shtm, undated.
"Notification of Transmittal of The International Search Report or the Declaration", PCT/US02/29461.
"Notification of Transmittal of The International Search Report or the Declaration", PCT/US03/07546.
"Notification of Transmittal of The International Search Report or the Declaration", PCT/US03/06577.
"Notification of Transmittal of The International Search Report or the Declaration", PCT/US03/07837.
"Improved Impedance Spectroscopy Technique For Status Determination of Production $Li/SO_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917,402.2.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of $23^{rd}$ International Teleco Conference (INTELEC)*, published Oct. 2001, IEE, pp. 433-440.
"Examination Report" from the U.K. Patent Office for U.K. App. No. 0417678.0.
Wikipedia Online Encyclopedia, Inductance, 2005, http://en.wikipedia.org/wiki/inductance, pp. 1-5, mutual Inductance, pp. 3,4.

CENTRALIZED DATA STORAGE OF CONDITION OF A STORAGE BATTERY AT ITS POINT OF SALE

BACKGROUND OF THE INVENTION

The present invention relates to testing of storage batteries. More specifically, the present invention relates to using a battery tester to centrally monitor sales of storage batteries.

Storage batteries, such as lead acid storage batteries of the type used in the automotive and standby power industry, have existed for many years. A number of battery testing techniques are known in the art. These techniques include measuring the specific gravity of acid contained in a storage battery. These techniques also include measuring a battery voltage and performing a load test on a battery in which a large load is placed on the battery and the response observed. More recently, a technique has been pioneered by Dr. Keith S. Champlin and Midtronics, Inc. of Willowbrook, Ill. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No.

6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Pat. No. 6,850,037, issued Feb. 1, 2005, entitled IN-VEHICLE BATTERY MONITOR; U.S. Pat. No. 6,871,151, issued Mar. 22, 2005, entitled ELECTRONIC BATTERY TESTER WITH NETWORK COMMUNICATION; U.S. Pat. No. 6,885,195, issued Apr. 26, 2005, entitled METHOD AND APPARATUS FOR AUDITING A BATTERY TEST; U.S. Pat. No. 6,888,468, issued May 3, 2005, entitled APPARATUS AND METHOD FOR PROTECTING A BATTERY FROM OVERDISCHARGE; U.S. Pat. No. 6,891,378, issued May 10, 2005, entitled ELECTRONIC BATTERY TESTER; U.S. Pat. No. 6,906,522, issued Jun. 14, 2005, entitled BATTERY TESTER WITH BATTERY REPLACEMENT OUTPUT; U.S. Pat. No. 6,906,523, issued Jun. 14, 2005, entitled METHOD AND APPARATUS FOR TESTING CELLS AND BATTERIES EMBEDDED IN SERIES/PARALLEL SYSTEMS; U.S. Pat. No. 7,909,287, issued Jun. 21, 2005, entitled ENERGY MANAGEMENT SYSTEM WITH AUTOMOTIVE VEHICLE; U.S. Pat. No. 6,914,413, issued Jul. 5, 2005, entitled ALTERNATOR TESTER WITH ENCODED OUTPUT; U.S. Pat. No. 6,913,483, issued Jul. 5, 2005, entitled CABLE FOR ELECTRONIC BATTERY TESTER; U.S. Pat. No. 6,930,485, issued Aug. 16, 2005, entitled ELECTRONIC BATTERY TESTER WITH BATTERY FAILURE TEMPERATURE DETERMINATION; U.S. Pat. No. 6,933,727, issued Aug. 23, 2005, entitled ELECTRONIC BATTERY TESTER CABLE, U.S. Pat. No. 6,941,234, filed Sep. 6, 2005, entitled QUERY BASED ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 10/883,019, filed Jul. 1, 2004, entitled MODULAR ELECTRONIC BATTERY TESTER; U.S. Ser. No. 10/896,835, filed Jul. 22, 2004, entitled BROAD-BAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NETWORK COMMUNICATION; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 60/665,070, filed Mar. 24, 2005, entitled OHMMETER PROTECTION CIRCUIT; U.S. Ser. No. 11/130,600, filed May 17, 2005, entitled QUERY BASED ELECTRONIC BATTERY TESTER; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Serial No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,169, filed Aug. 31, 2005, entitled LOAD TESTER SIMULATION WITH DISCHARGE COMPENSATION, which are, incorporated herein in their entirety Many storage batteries, such as automotive batteries, include a limited warranty. The limited warranty guarantees that the storage battery will function properly for a set amount of time. If the storage battery was to become inoperative within the allotted warranty term, then a customer can receive a rebate for the cost of a replacement storage battery.

Unfortunately, storage battery warranty privileges are often misused and abused. In particular, a customer can request a replacement battery under warranty without the retailer or dealer realizing that each time the customer replaces a storage battery the warranty term is being reset. Therefore, a warranty term could last forever, if the customer were to replace their old battery each time a customer's warranty is about to expire.

SUMMARY OF THE INVENTION

The present invention includes methods and systems for monitoring sales of storage batteries. A battery tester is coupled to a select storage battery that is being purchased. A storage battery identifier is entered into the battery tester that identifies the select storage battery. A battery test is performed on the select storage battery with the battery tester. A battery test code is generated that is related to a condition of the select storage battery and the storage battery identifier. The battery test code is communicated to a centralized database.

The select storage battery is subsequently tested after the select storage battery has been placed into use. The results of the subsequent test indicate that the select storage battery has become inoperative. A battery tester is coupled to a replacement storage battery that is replacing the select storage battery. A replacement storage battery identifier is entered into the battery tester that identifies the replacement storage battery. A battery test is performed on the select storage battery with the battery tester. A replacement battery test code is generated that is related to a condition of the replacement storage and the replacement storage battery identifier. The replacement battery test code is communicated to a centralized database. The replacement battery test code is associated with the battery test code of the select storage battery in the centralized database.

DETAILED DESCRIPTION OF THE PREFERRED EMBODIMENTS

The present invention provides methods and systems for monitoring sales of storage batteries using a battery tester. A limited warranty can be easily registered and activated by a customer for the storage batteries and easily policed by a dealer or retailer.

Figure 1:
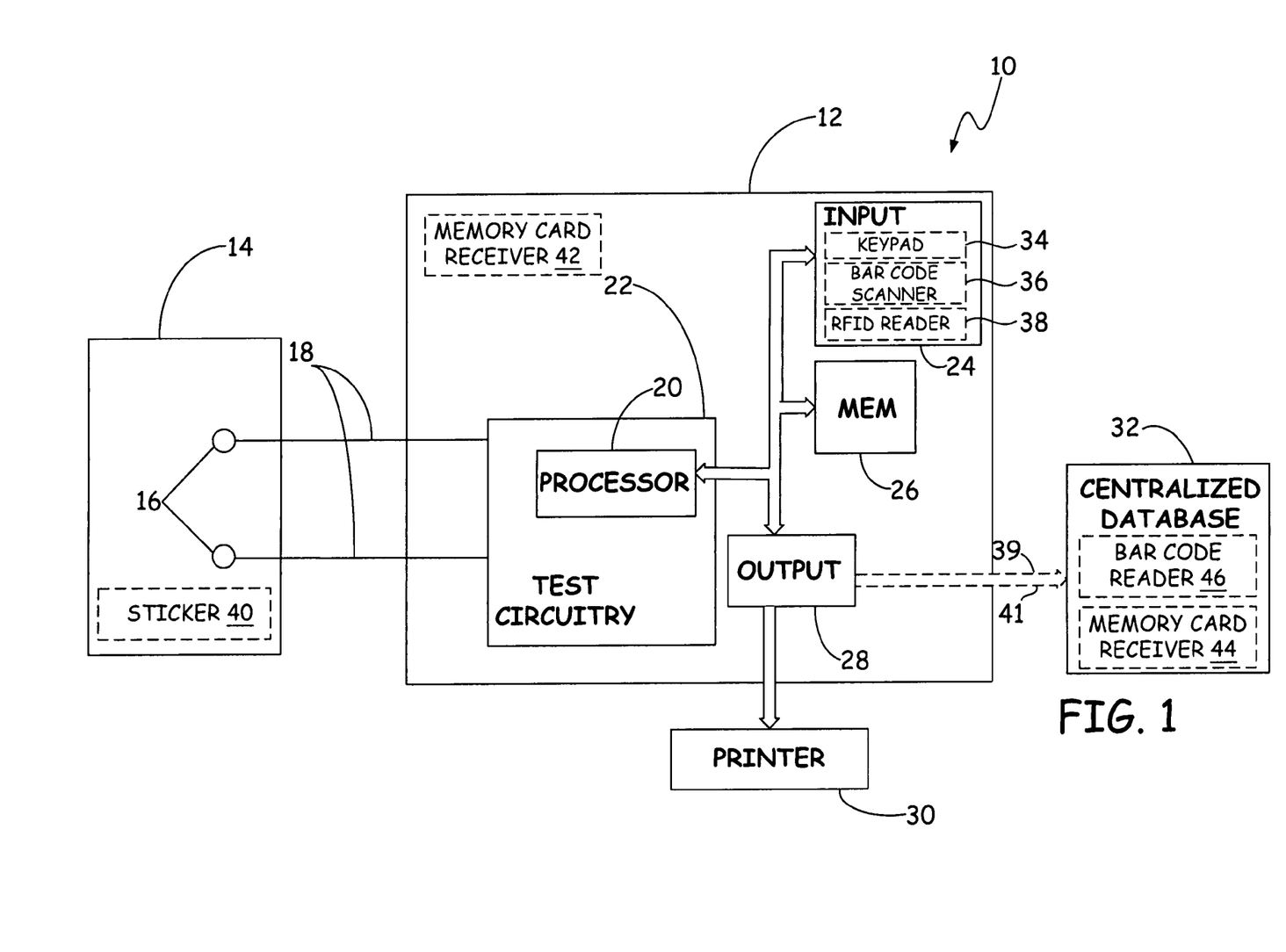
FIG. 1 illustrates a simplified block diagram of a system for monitoring sales of storage batteries in accordance with embodiments of the present invention.

FIG. 1 is a simplified block diagram of a system 10 for monitoring sales of storage batteries in accordance with embodiments of the present invention. System 10 includes a battery tester 12 coupled to a select storage battery 14 that is being purchased, printer 30 and centralized database 32. Note that FIG. 1 is illustrative of a specific type of battery tester 12, which measures dynamic parameters. However, in one aspect, the present invention is applicable to any type of battery tester including those which do not use dynamic parameters. Other types of example testers include testers that conduct load tests, current based tests, voltage based tests, tests which apply various conditions or observe various performance parameters of a battery, etc.

Battery tester 12 is coupled to terminals 16 of select storage battery 14 via connectors 18. For example, connectors 18 may provide Kelvin connections to select storage battery 14. Battery tester 12 includes test circuitry 22. Test circuitry 22 contains processor 20 and other circuitry configured to generate test results related to measuring a dynamic parameter of select storage battery 14. As used herein, a dynamic parameter is one which is related to a signal having a time varying component. The signal can be either applied to or drawn from battery 14.

Besides assisting in measuring dynamic and non-dynamic parameters of select storage battery 14 and generating test data on select storage battery 14, processor 20 also controls the operation of other components within battery tester 12. Battery tester 12 also includes input 24, memory 26 and output 28. Processor 20 controls the operation of these and other components within test circuitry 22 and, in turn, carries out different functions based upon battery testing instructions stored in memory 26. For example, battery tester 12 can receive a storage battery identifier, such as a serial number, through input 24 that corresponds to select storage battery 14. Battery tester can also be configured to generate a battery test code. The battery test code can include the storage battery identifier and encoded battery test results or test data.

Input 24 can receive information in a variety of ways. In one embodiment, input 24 can include a touch pad or keypad 34. For example, a storage battery identifier corresponding to select storage battery 14 can be entered into battery tester 12 by typing. In another embodiment, input 24 can include a bar code scanner 36. For example, a serial number label can be located on select storage battery 14 in the form of a bar code. Input 24 can include a scanner for scanning the bar code on the serial number label into battery tester 12. In yet another embodiment, input 24 can include a radio frequency identification (RFID) reader 38 and select storage battery 14 includes a RFID tag having the corresponding storage battery identifier or serial number. For example, the RFID tag is configured to transmit a signal that includes serial number information. RFID reader 38 can receive the signal transmitted by the RFID tag on select storage battery 14. Those skilled in the art should recognize that input 24 can receive information in other ways besides those that are discussed above and illustrated in FIG. 1.

Generally, battery tester 12 is in communication with printer 30 via output 28 such that the printer will print test data related to test results provided by test circuitry 22. Processor 20 can also supply output 28 with the storage battery identifier information entered into input 24. Battery tester 12 is also in communication with centralized database 32. Centralized database 32 is housed in a computing device that can be positioned remotely from battery tester 12. For example, centralized database 32 can be positioned in a different location in a retail establishment than the location of battery tester 12. Centralized database 32 and battery tester 12 can communicate over a radio frequency signal or infrared signal. In another example, centralized database 32 can be positioned off-site from battery tester 12. In this example, centralized database 32 communicates with battery tester 12 over a network, such as the Internet. Centralized database 32 is configured to receive and store the battery test code related to select storage battery 14.

Figure 2:
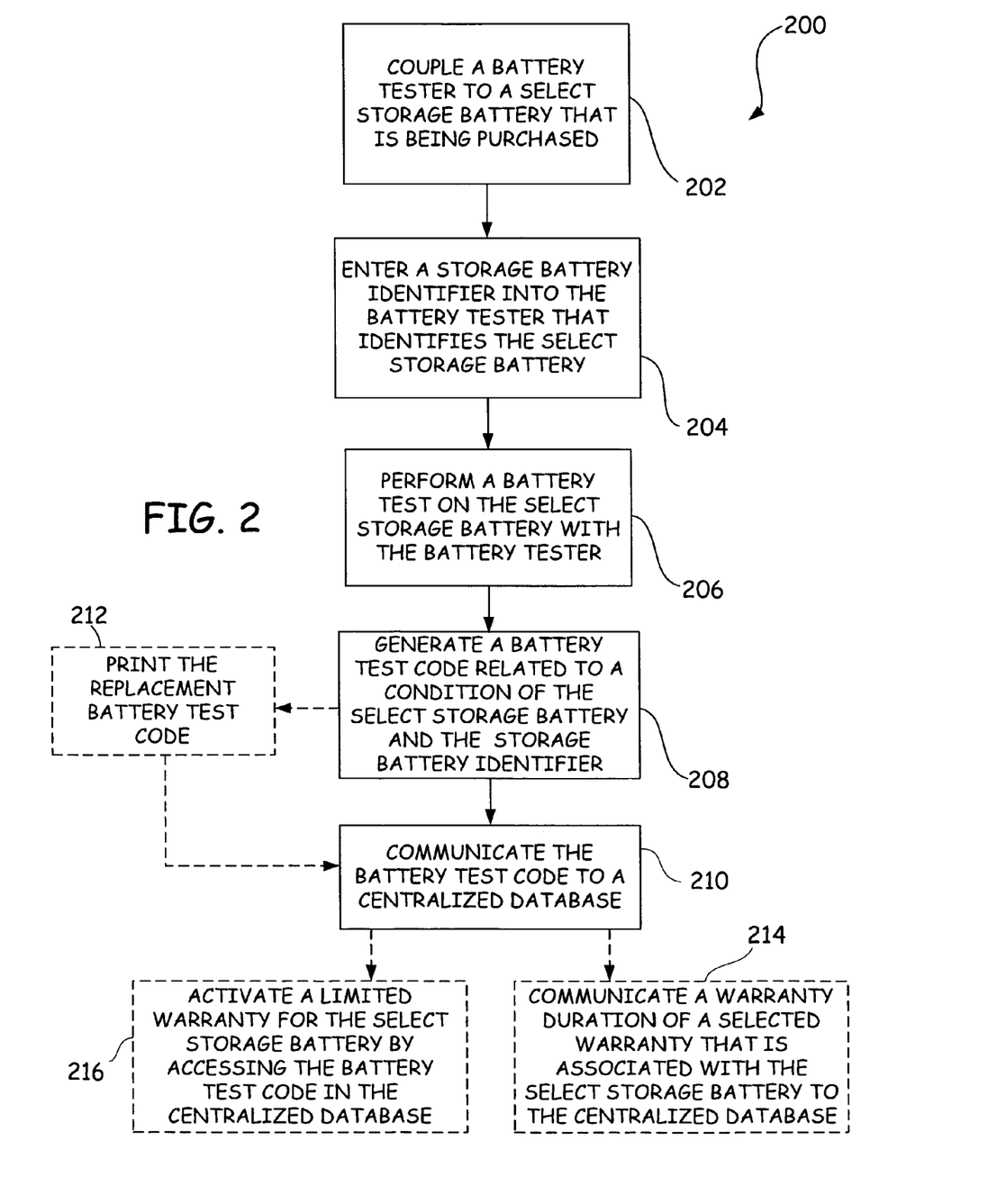
FIG. 2 is a flowchart illustrating a method of monitoring sales of storage batteries in accordance with embodiments of the present invention.

FIG. 2 is a flowchart 200 illustrating a method of monitoring sales of storage batteries in accordance with embodiments of the present invention. A customer enters a retailer or dealer of storage batteries of which the customer desires to purchase. The customer selects a select storage battery 14 (FIG. 1) that he or she desires to purchase. To monitor the sale, the following steps are performed. At block 202, a battery tester 12 (FIG. 1) is coupled to select storage battery 14. At block 204, a storage battery identifier that identifies select storage battery 14 is entered into battery tester 12 through input 24 (FIG. 1). As previously discussed, the storage battery identifier can be a serial number associated with select storage battery 14 and input 24 can be a keypad or touch pad, a bar code scanner or a RFID reader. To utilize a bar code scanner, select storage battery 14 can include a bar code attached to an outer surface of the storage battery housing such that it can be easily scanned. The bar code includes the storage battery identifier.

At block 206, a battery test on select storage battery 14 is performed with battery tester 12. As previously discussed, battery tester 12 can perform a battery test that measures dynamic parameters and/or non-dynamic parameters of select storage battery 14. At block 208, a battery test code is generated that is related to a condition of select storage battery 14 and the storage battery identifier. The battery test code can include the storage battery identifier as well as encoded battery test results. The encoded battery test results include information generated during the step of performing a battery test. At block 210, the battery test code is communicated to centralized database 32 (FIG. 1).

In one embodiment, instead of the method of flowchart 200 proceeding from block 208 to 210, the method of flowchart 200 proceeds from block 208 to block 212. At block 212, the battery test code is transmitted to printer 30 for printing. Printer 30 prints the battery test code including the storage battery identifier and the battery test results on a ticket. The ticket printed by printer 30 will be given to the customer or purchaser of select storage battery 14 such that the storage battery can be later identified. In addition, the ticket is used to show that select storage battery 14 was operative or healthy at the time of purchase. The ticket can also be used by the customer to register and activate a limited warranty. Although FIG. 2 illustrates the method proceeding from block 208 to block 212, it should be noted that communicating the battery test code to centralized database 32 can happen prior to printer 30 printing the battery test code.

In some embodiments, battery tester 12 automatically transmits the battery test code to centralized database 32. Automatically transmitting the battery test code can occur by sending the battery test code over a network 39, such as the Internet, or transmitting the battery test code using an infrared or RF signal 41 to centralized database 32. In other embodiments, a dealer can manually enter this data into centralized database 32. For example, the storage battery identifier can be manually entered into centralized database 32 instead of the storage battery identifier being communicated to centralized database 32 via the battery test code. In one such embodiment, a storage battery can include a multi-part tear-off sticker or tag 40 as illustrated in FIG. 1. When a storage battery is sold or warranted, a removable portion of the tear-off sticker 40 can be removed and stuck to the tester printout. The removable portion of the tear-off sticker 40 will include the storage battery identifier or serial number. In another such embodiment, battery tester 12 can write data to a removeable memory card insertable in a memory card receiver 42 as illustrated in FIG. 1. A removeable memory card can be inserted into memory card receiver 42 of battery tester 12 such that the battery test code can be written to it. To transfer the battery test code to centralized database 32, the removeable memory card is removed from receiver 42 and inserted into a memory card receiver 44 in centralized database 32 for uploading. In yet further such embodiments, the battery test code can be printed onto a printout other than the printout printed for the customer. Either the battery test code can be printed as a bar code or in a human readable form. The battery test code is transferred to centralized database 32 by a dealer scanning the battery test code in the form of a bar code into the centralized database or by manually entering the human readable battery test code into the centralized database. To scan in the battery test code, centralized database 32 includes a bar code reader 46.

Besides communicating a battery test code to centralized database 32, other information can also be communicated to centralized database 32. In one embodiment, a customer identifier that identifies the purchaser of the select storage battery can be communicated to centralized database 32. In another embodiment and as illustrated in block 214 of FIG. 2, a warranty duration of a selected warranty that is associated with select storage battery 14 can be communicated to centralized database 32. The warranty duration is associated with the battery test code in centralized database 32. It should be noted that other relevant information related to select storage battery 14 can be communicated to centralized database 32. The above list is not an exhaustive list.

In one embodiment, the method of flowchart 200 further proceeds to block 214 from block 210. At block 214, a limited warranty associated with select storage battery 14 can be activated. To activate the limited warranty, a customer or purchaser can access the battery test code that is associated with select storage battery 14 and a warranty duration in centralized database 32. In the alternative, the customer may have to purchase a limited warranty or purchase an extended limited warranty that is outside of the warranty that came with the purchased battery. Centralized database 32 can be accessed via a network, such as the Internet, over the telephone or through the mail.

Figure 3:
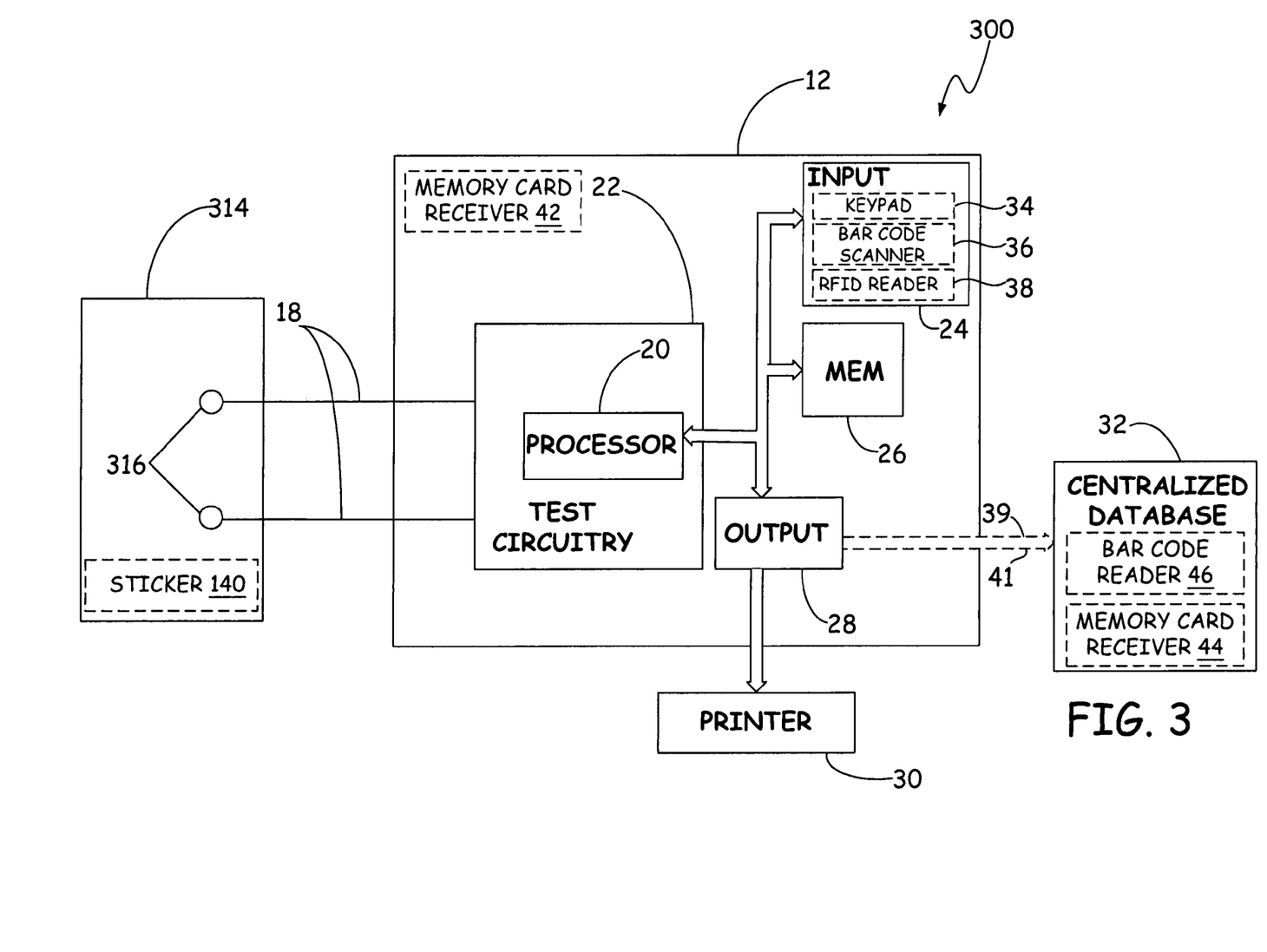
FIG. 3 is a simplified block diagram of a system for monitoring replacement storage batteries in accordance with embodiments of the present invention.

FIG. 3 is a simplified block diagram of a system 300 in accordance with embodiments of the present invention. System 300 is similar to system 10 of FIG. 1 in that system 300 includes battery tester 12 coupled to printer 30 and centralized database 32. Detailed information related to battery tester 12, printer 30 and centralized database 32 is described above. However, a situation can occur where select storage battery 14 (FIG. 1), which was previously purchased under a limited warranty, has become inoperative and is in need of replacement. In such a situation (not illustrated), the customer can return to the dealer or retailer where the select storage battery 14 was previously purchased. In the alternative, the customer can return to a dealer that is associated with dealer where select storage battery 14 was previously purchased. At the dealer, select storage battery 14 undergoes a subsequent test to verify its defectiveness. To subsequently test select storage battery 14, the storage battery identifier of select storage battery 14 is entered into battery tester 12. The battery test is performed and a battery test code is generated that indicates the storage battery identifier and the subsequent battery test. After select storage battery 14 is verified as inoperative a replacement storage battery 314 is selected to replace select storage battery 14. It should be noted that although FIG. 3 illustrates the same battery tester 12 and printer 30 being used to replace the select storage battery 14, those skilled in the art will recognize that a different battery tester and printer can be used as long as the battery tester is coupled to centralized database 32.

Figure 4:
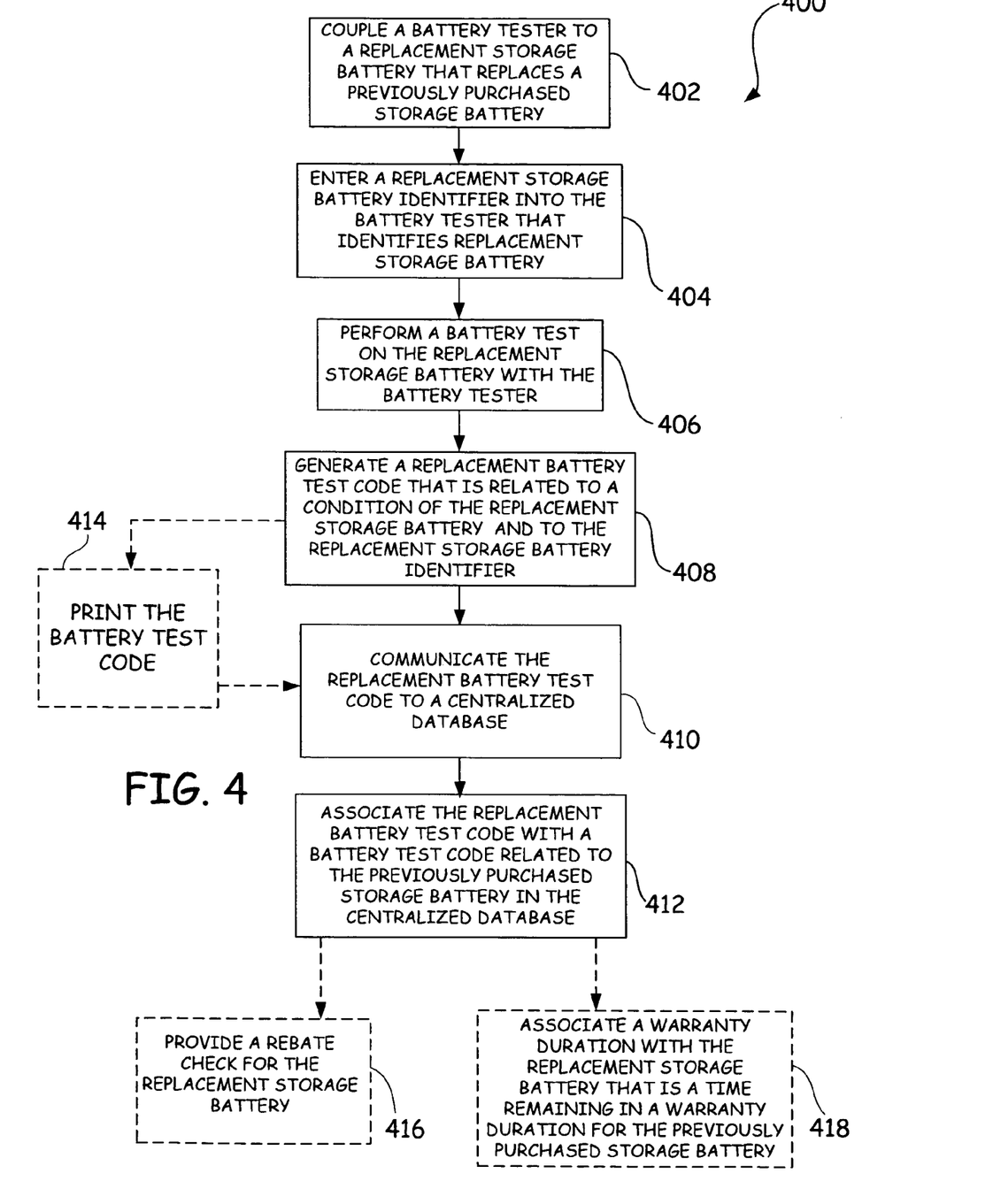
FIG. 4 is a flowchart illustrating a method for monitoring replacement storage batteries in accordance with embodiments of the present invention.

FIG. 4 is a flowchart 400 illustrating a method of monitoring replacements of storage batteries. Before battery tester 12 begins the method illustrated in FIG. 4, a replacement storage battery 314 is selected to replace select storage battery 14.

At block 402, battery tester 12 (FIG. 3) is coupled to a replacement storage battery 314. Replacement storage battery 314 replaces the select storage battery 14 (FIG. 1) or replaces a storage battery previously purchased. Either select storage battery 14 or the storage battery previously purchased is inoperative. At block 404, a replacement storage battery identifier that identifies replacement storage battery 314 is entered into battery tester 12 through input 24 (FIG. 3). Similar to select storage battery 14, the replacement storage battery identifier can be a serial number associated with replacement storage battery 314. As previously discussed, input 24 can be a keypad or touch pad, a bar code scanner or a RFID reader.

At block 406, a battery test on replacement storage battery 314 is performed with battery tester 12. As previously discussed, battery tester 12 can perform a battery test that measures dynamic parameters and/or non-dynamic parameters of replacement storage battery 314. At block 408, a replacement battery test code related to a condition of the replacement storage battery 314 and to the replacement storage battery identifier are generated. The replacement battery test code can include the replacement storage battery identifier as well as encoded replacement battery test results. The encoded replacement battery test results include information generated during the step of performing a battery test on replacement storage battery 314. At block 410, the replacement battery test code is communicated to centralized database 32 (FIG. 3). At block 412, the replacement battery test code is associated with the battery test code of the previously purchase storage battery or select storage battery 14 in centralized database 32.

In one embodiment, instead of the method of flowchart 400 proceeding from block 408 to 410, the method of flowchart 400 proceeds from block 408 to block 414. At block 414, the replacement battery test code is transmitted to printer 30 for printing. Printer 30 prints the battery test code including the replacement storage battery identifier and the replacement battery test results on a ticket. The ticket printed by printer 30 will be given to the customer or purchaser of replacement storage battery 14 such that the storage battery can be later identified. In addition, the ticket is used to show that replacement storage battery 314 was operative or healthy at the time of purchase. The ticket can also be used by the customer to redeem a value for the replacement storage battery in the form of a provided rebate check as illustrated at block 416. Block 416 will be further discussed below. Although FIG. 4 illustrates the method proceeding from block 408 to block 414, it should be noted that communicating the replacement battery test code to centralized database 32 can happen prior to printer 30 printing the replacement battery test code.

In some embodiments, battery tester 12 automatically transmits the replacement battery test code to centralized database 32. Automatically transmitting the battery test code can occur by sending the battery test code over a network, 39, such as the Internet, or transmitting the battery test code using an infrared or RF signal 41. In other embodiments, a dealer can manually enter this data into centralized database 32. For example, the replacement storage battery identifier can be manually entered into centralized database 32 instead of the replacement storage battery identifier being communicated to centralized database 32 via the battery test code. In such an embodiment, a replacement storage battery can include a multi-part tear-off sticker or tag 140. When a replacement storage battery replaces a previously purchased storage battery, a removable portion of the tear-off sticker 140 can be removed and stuck to the tester printout for the replacement storage battery. Since the printout for the previously purchased storage battery also includes a tear-off sticker, such as sticker 40 in FIG. 1, a dealer has the ability to tie the previously purchased battery to the replacement battery without direct connection between a battery tester and a centralized database. Using the sticker 40 on the printout of the previously purchased storage battery, the dealer can manually find the storage battery identifier of the previously purchased storage battery in centralized database 32 and tie it to the replacement battery. In another such embodiment, battery tester 12 can write data to a removeable memory card insertable in a memory card receiver 42 as illustrated in FIG. 3. Removeable memory card can be inserted into memory card receiver 42 of battery tester 12 such that the replacement battery test code can be written to it. To transfer the replacement battery test code to centralized database 32, the removeable memory card is removed from receiver 42 and inserted into a memory card receiver 44 in centralized database 32 for uploading. In yet further such embodiments, the replacement battery test code can be printed onto a printout other than the printout printed for the customer. Either the replacement battery test code can be printed as a bar code or in a human readable form. The replacement battery test code is transferred by a dealer to centralized database 32 by scanning the battery test code in the form of a bar code into the centralized database or by manually entering the human readable replacement battery test code into the centralized database. To scan in the battery test code, centralized database 32 includes a bar code reader 46.

Besides communicating a replacement battery test code to centralized database 32, other information can also be communicated to centralized database 32. In one embodiment, a customer identifier that identifies the purchaser of the replacement storage battery 314 can be communicated to centralized database 32. The replacement storage battery purchaser can be compared to the customer of the previously purchase storage battery. It should be noted that other relevant information related to replacement storage battery 314 can be communicated to centralized database 32. The above list is not an exhaustive list.

At block 418, a warranty duration is associated with replacement storage battery 314 that is a time remaining in a warranty duration for the previously purchased storage battery or select storage battery 14. Centralized database 32 automatically subjects replacement storage battery 314 to the limited warranty of the previously purchased storage battery or select storage battery 14. For example, if the limited warranty on select storage battery 14 had a one-year duration remaining, then the limited warranty on the replacement storage battery 314 is for one year. If the duration of the select storage battery 14 had only one day remaining, then the limited warranty on the replacement storage battery 314 is one day. However, it is possible for the dealer to grant an extended limited warranty if the amount of time left on the limited warranty is short. For example, the dealer could grant a 30 to 90 day extended warranty on replacement storage battery 14 that only has a limited warranty of one day left. However, it is also possible that the dealer may not grant an extended warranty and the customer can optionally purchase an extended warranty on select storage battery 14 that will cover replacement storage battery 314.

If a warranty duration can not be associated with replacement storage battery 314 because the previously purchase storage battery or select storage battery 14 is no longer covered by a limited warranty, then the customer can activate a limited warranty on the replacement storage battery. However, the customer will be unable to redeem a value of replacement storage battery 314 because there is no longer an active limited warranty for select storage battery 14. In other words, either select storage battery 14 never had an activated limited warranty or the limited warranty on select storage battery 14 has expired.

At block 416, replacement battery test code stored in centralized database 32 is accessed to redeem a value of the replacement storage battery 314. Redeeming a value of the replacement storage battery 314 is only available to a customer if the select storage battery 14 is under an active limited warranty. The customer can redeem the value of the replacement battery via a network, such as the Internet, over a telephone or through the mail. When a customer accesses centralized database 32 to redeem a value of the replacement battery, the customer will receive a rebate check. In the alternative, the dealer can pre-approve the warranty or redemption and give the replacement battery to the customer at no additional cost. In such a way, the dealer will receive the rebate check instead of the customer.

Although the present invention has been described with reference to preferred embodiments, workers skilled in the art will recognize that changes may be made in form and detail without departing from the spirit and scope of the invention.

What is claimed is:

1. A method of monitoring sales of storage batteries, the method comprising:
    coupling a battery tester to a select storage battery that is being purchased;
    entering a storage battery identifier into the battery tester that identifies the select storage battery;
    performing a battery test on the select storage battery with the battery tester;
    generating a battery test code related to a condition of the select storage battery derived from the battery test and the storage battery identifier; and
    communicating the battery test code to a centralized database.

2. The method of claim 1, wherein the battery test code comprises the storage battery identifier and encoded battery test results, the encoded battery test results comprising information generated during the step of performing a battery test.

3. The method of claim 1, further comprising printing the battery test code.

4. The method of claim 3, further comprising removing a removable portion of a multi-part sticker on the select storage battery and placing the removable portion of the multi-part sticker on a printout that includes the printed battery test code.

5. The method of claim 1, further comprising activating a limited warranty for the select storage battery by accessing the battery test code that is associated with the select storage battery in the centralized database.

6. The method of claim 1 including communicating information that identifies a purchaser of the select battery to the centralized database.

7. The method of claim 1 including communicating a warranty duration of a selected warranty that is associated with the select storage battery to the centralized database.

8. The method of claim 1 including associating information that identifies a purchaser of the select battery and associating information of a warranty duration with the battery test code in the centralized database.

9. The method of claim 1, wherein entering the storage battery identifier comprises entering the storage battery identifier through an input on the battery tester.

10. The method of claim 9, wherein the input on the battery tester comprises an input selected from the group of inputs consisting of a keypad, a bar code scanner and a RFID reader.

11. The method of claim 1, wherein communicating the battery test code to a centralized database comprises communicating the battery test code over a network.

12. The method of claim 1, wherein communicating the battery test code to a centralized database comprises communicating the battery test code over one of a infrared and RF signal.

13. The method of claim 1, wherein communicating the battery test code to a centralized database comprises:
    storing the battery test code on a removeable memory card insertable in a memory card receiver in the battery tester; and
    uploading the battery test code to the centralize database by removing the memory card from the battery tester and inserting the memory card into a memory card receiver in the centralized database.

14. The method of claim 1, wherein communicating the battery test code to a centralized database comprises:
    printing the battery test code onto a printout in the form of a bar code; and
    scanning the bar code into the centralized database using a bar code reader coupled to the centralized database.

15. The method of claim 1, wherein communicating the battery test code to a centralized database comprises:
    printing the battery test code onto a printout in a human readable form; and
    manually entering the battery test code into the centralized database based on the human readable form of the printout.

16. The method of claim 1, further comprising:
    subsequently testing the select storage battery after the select storage battery has been placed into use; and
    providing a replacement storage battery after the subsequent test of the select storage battery.

17. The method of claim 16, further comprising associating a warranty duration with the replacement storage battery that is related to time remaining of a warranty duration for the select storage battery.

18. The method of claim 17, further comprising providing a rebate check for the replacement storage battery.

19. The method of claim 16, further comprising:
    entering the storage battery identifier of the select storage battery prior to subsequently testing the select storage battery; and
    generating a battery test code that indicates the storage battery identifier and the subsequent test.

20. The method of claim 19, further comprising:
    entering a replacement storage battery identifier for the replacement battery; and
    generating a replacement battery test code that indicates the replacement storage battery identifier and a battery test of the replacement battery.

21. The method of claim 20, further comprising associating the replacement battery test code with the battery test code of the select storage battery in the centralized database.

22. A method of monitoring replacements of storage batteries, the method comprising:
    coupling a battery tester to a replacement storage battery that is replacing a previously purchased storage battery;
    entering a replacement storage battery identifier into the battery tester that identifies the replacement storage battery;
    performing a battery test on the replacement storage battery with the battery tester;
    generating a replacement battery test code related to a condition of the replacement storage battery derived from the battery test and to the replacement storage battery identifier;
    communicating the replacement battery test code to a centralized database; and
    associating the replacement battery test code with a battery test code related to the previously purchased storage battery in the centralized database.

23. The method of claim 22, further comprising associating a warranty duration with the replacement storage battery that is a time remaining in a warranty duration of the previously purchased storage battery.

24. The method of claim 22, further comprising providing a rebate check for the replacement storage battery.

25. The method of claim 22, further comprising printing the replacement battery test code.

26. The method of claim 22, wherein communicating the replacement battery test code to a centralized database comprises communicating the replacement battery test code over one of a infrared and RF signal.

27. The method of claim 22, wherein communicating the replacement battery test code to a centralized database comprises:
storing the battery test code on a removeable memory card insertable in a memory card receiver in the battery tester; and
uploading the replacement battery test code to the centralize database by removing the memory card from the battery tester and inserting the memory card into a memory card receiver in the centralized database.

28. The method of claim 22, wherein communicating the replacement battery test code to a centralized database comprises:
printing the replacement battery test code onto a printout in the form of a bar code; and
scanning the bar code into the centralized database using a bar code reader coupled to the centralized database.

29. The method of claim 22, wherein communicating the replacement battery test code to a centralized database comprises:
printing the replacement battery test code onto a printout in a human readable form; and
manually entering the replacement battery test code into the centralized database based on the human readable form of the printout.

30. A system for monitoring sales of storage batteries, the system comprising:
a battery tester coupled to a select storage battery that is being purchased, the battery tester configured to:
receive a storage battery identifier that identifies the select storage battery;
perform a battery test on the select storage battery;
generate a battery test code that indicates the storage battery identifier and encoded battery test results that includes information generated during the performing of the battery test; and
a centralized database coupled to the battery tester and configured to receive and store the battery test code.

31. The system of claim 30, further comprising a printer configured to print the battery test code.

32. The system of claim 30, wherein the centralized database is further configured to receive a warranty duration of a selected warranty that is associated with the battery test code of the select storage battery.

33. The system of claim 30, wherein the battery tester is further configured to subsequently test the select storage battery after the select storage battery has been placed into use.

34. The system of claim 33, wherein the battery tester is further configured to:
receive a replacement storage battery identifier for a replacement battery that is to replace the select storage battery; and
generate a replacement battery test code indicating the replacement storage battery identifier and encoded battery test results that includes information generated during the battery test of the replacement battery.

35. The system of claim 34, wherein the centralized database is configured to associate the replacement battery test code with the battery test code of the select storage battery.

* * * * *